(12) United States Patent
Satsu et al.

(10) Patent No.: US 6,225,418 B1
(45) Date of Patent: May 1, 2001

(54) THERMOSETTING RESIN COMPOSITION

(75) Inventors: Yuichi Satsu; Harukazu Nakai, both of Hitachi; Akio Takahashi, Hitachiota; Masao Suzuki; Katsuo Sugawara, both of Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/275,875

(22) Filed: Mar. 25, 1999

(30) Foreign Application Priority Data

Oct. 6, 1998 (JP) .................................................. 10-283792

(51) Int. Cl.$^7$ ............................. C08L 63/00; C08L 83/06
(52) U.S. Cl. .................. 525/524; 528/421; 528/418; 528/32; 528/10; 528/27; 528/38; 525/476; 549/512; 549/215; 556/438; 428/447; 257/783; 257/738; 427/387; 427/386
(58) Field of Search ................................... 528/421, 418, 528/32, 38, 27; 525/524, 476; 549/512, 215; 556/458; 428/447; 257/783, 738; 427/387, 386

(56) References Cited

U.S. PATENT DOCUMENTS

| 5,457,003 | * | 10/1995 | Tanaka et al. . |
| 5,952,439 | * | 9/1999 | Morita et al. . |
| 6,005,060 | | 12/1999 | Murata, et al. ...................... 525/523 |

FOREIGN PATENT DOCUMENTS

| 7-331069 | * | 12/1995 | (JP) . |
| 7-331070 | * | 12/1995 | (JP) . |
| 8-199045 | * | 8/1996 | (JP) . |
| 9-216938 | * | 8/1997 | (JP) . |
| 9-291131 | * | 11/1997 | (JP) . |
| 10-298405 | | 11/1998 | (JP) . |

* cited by examiner

Primary Examiner—Robert Dawson
Assistant Examiner—Kuo-Liang Peng
(74) Attorney, Agent, or Firm—Antonelli, Terry, Stout & Kraus, LLP

(57) ABSTRACT

A thermosetting resin composition obtained by heat treating, under the specified conditions, a mixture of a polyaddition thermosetting resin, a silicic compound (oligomer) having a functional group capable of causing an addition reaction with a curing agent for the polyaddition thermosetting resin, and water, followed by adding of a curing agent for the polyaddition thermosetting resin is useful for producing thermosetting resin molded articles, resin encapsulated semiconductor devices, automobile parts, etc., which are high in heat resistance, small in change of elastic modulus at high temperatures, and resistant to crack and peeling.

4 Claims, 3 Drawing Sheets

THERMOSETTING RESIN COMPOSITION

BACKGROUND OF THE INVENTION

The present invention relates to a thermosetting resin composition (or a mixture of such materials) useful for semiconductor encapsulants, printed circuit substrates, automobile parts, etc., a process for producing such a composition, molded articles thereof and their uses.

Thermosetting resin compositions are widely used for semiconductor devices, printed circuit substrates, automobile parts, etc., but none of the available compositions is well satisfactory in terms of qualities. Various attempts have been made for improving dynamic properties of the resins at high temperatures. For instance, JP-A 7-331069 and JP-A 7-331070 disclose a method in which a metallic oxide sol is dispersed in a polyamideimide resin; JP-A 8-100107 proposes to polycondensate an epoxy resin by adding a metal alkoxide; JP-A 9-216938 teaches to have a metal alkoxide swollen in a phenol resin before polycondensing it; and JP-A 9-291131 proposes a method in which a metal alkoxide is added to a polyurethane resin and condensed by a sol-gel method. These methods, however, have a problem in that the curing reaction for polycondensation is accompanied by the generation of water and tends to cause swelling at the interfaces of the composite material. Also, none of the proposed techniques concerns means for preventing swelling and cracking which may occur at the interfaces of the composite material with change of temperature.

JP-A 8-199045 proposes a method in which in order to suppress the generation of thermal stress, an alkoxysilane and water are added to an epoxy resin dissolved in an organic solvent, and after the alkoxy groups of the alkoxysilane have been hydrolyzed, the solvent is removed and the remaining material is heated to effect curing of the resin and dehydration of the hydroxyl groups. This method, however, involves the problems concerning generation of water and adhesion at the interfaces of the composite material at high temperatures.

The conventional techniques come down to an expedient for making a composite material by curing a mixture of a thermosetting resin, a silicic compound and water with a base material such as a metal, a ceramic material or other resin. According to this method, water and an alcohol are formed as by-products in the course of curing. These by-producted water and alcohol give rise to various ill effects, such as corrosion of the metallic base, swelling at the interface between base and resin, and cracking or exfoliation of the molded article. Also, the conventional art neglects means for preventing occurrence of swelling and cracks at the base/resin interface incidental to change of temperature.

BRIEF SUMMARY OF THE INVENTION

The present invention is intended to provide a thermosetting resin composition (or a mixture of such materials) which is high in heat resistance, small in difference in modulus of elasticity and thermal expansion coefficient between high temperatures and room temperature, and resistant to cracking and peeling, a process for producing such a composition, and the products using the composition, such as thermosetting resin molded articles, semiconductor devices, encapsulants for semiconductor devices, and printed circuit substrates.

The present invention provides a thermosetting resin composition comprising:

(A) a polyaddition thermosetting resin;

(B) a silicic compound represented by the following formula (1) or (2):

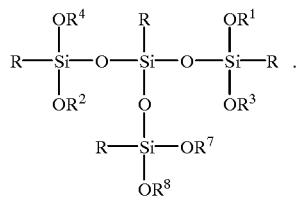

(1)

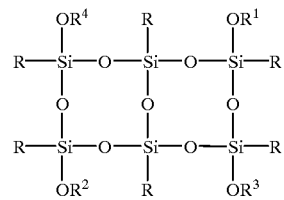

(2)

wherein R is an organic group containing a functional group which causes an addition reaction with a curing agent for said polyaddition thermosetting resin, $R^1$, $R^2$, $R^3$ and $R^4$, $R^7$ and $R^8$ are each a silicic group of the formula: $Si_n R_n O_m (OH)_j(OR')_k$, wherein R' is methyl or ethyl, and when n is zero, $R^1$, $R^2$, $R^3$, $R^4$, $R^7$ and $R^8$ are independently hydrogen, methyl or ethyl, and when n is 1,2 or 3, j is an integer of zero to 2n, k is an integer of 0 to 2n and m+j+k=6. For example, when n=3, j is 0 to 6, k is 0 to 6, and m+j+k=6; and (C) a curing agent of said polyaddition thermosetting resin.

The present invention also provides a process for producing said thermosetting resin composition, its molded articles and other products using the composition, such as resin encapsulated semiconductors.

DETAILED DESCRIPTION OF THE INVENTION

Figure 1:
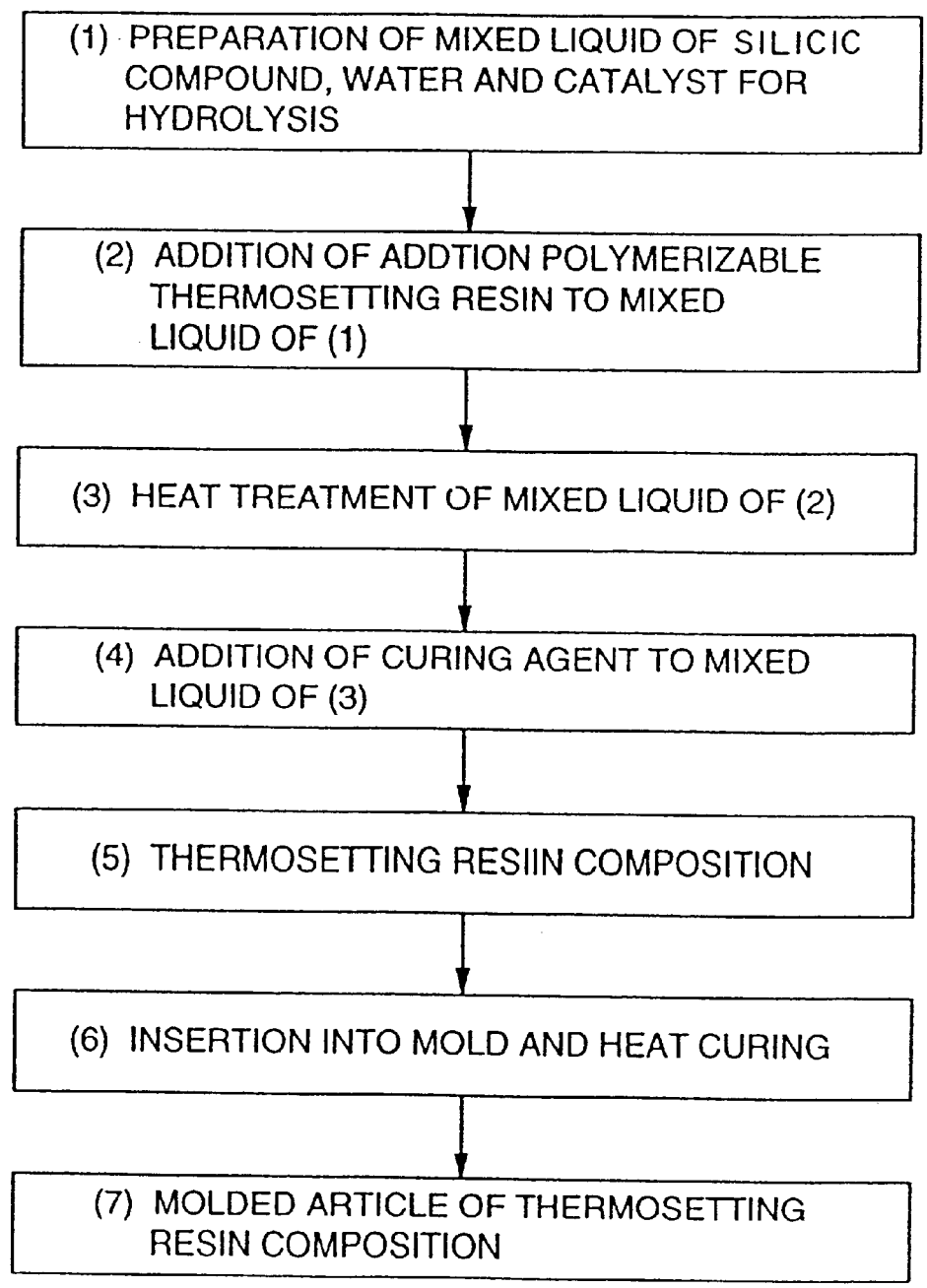
FIG. 1 is a block diagram illustrating the production process of a thermosetting resin composition according to Example 1 of the present invention.

In practical use of thermosetting resins for semiconductor devices, printed circuit substrates, automobile parts and such, the following matters are of much account for preventing exfoliation (or peeling) and cracking caused by change of temperature. The thermosetting resins used for semiconductor devices are required to be protective against thermal stress at various interfaces in the composite material and also resistant to swelling and cracking so that the semiconductor devices will operate correctly after solder reflow at 260° C. and in the heat cycle between −50° C. and 150° C. In use for the printed circuit substrates, it is necessary to heat and apply a local pressure to the substrate when forming electrical connections between the silicon chips and the substrate by wire bonding or by use of CCB. In this case, if the substrate is softened by heating, metal/metal adhesion may become incomplete, causing easy separation between metals due to heat history or by a force from the outside in the ensuing manufacturing steps or at the time of operation of the device. It is also required of the substrate that it would not be deformed when immersed in a solder bath of 260° C. or above, and that it is proof against disconnection or break of wires and cracking under thermal stress at the various interfaces in the −50° C. 150° C. heat cycle. The thermosetting resins used for automobile parts are also required to be resistant to deformation under thermal stress at the interfaces even when subjected to a thermal shock at temperatures between −40° C. and 140° C. and to remain free from chemical changes on exposure to salinity in the environment and other elements such as oils, battery liquid, etc. It is also an essential requirement that no swelling is caused by gas or water generated during curing of the resin in the manufacturing process of semiconductor devices, printed circuit substrates, automobile parts, etc.

In order to obtain a thermosetting resin composition having high heat resistance, small in difference in modulus of elasticity and thermal expansion coefficient between high temperatures and room temperature and resistant to cracking and peeling, such as described above, it is essential to reduce the stress generated by a thermal change between the resin and the substrate material and to secure a modulus of elasticity sufficient to prevent deformation of the resin under load of an external force at high temperatures. For reducing stress, it is imperative not only to coordinate thermal expansion between the resin and the substrate material but also to keep constant the thermal expansion coefficient against the change of temperature. It is of particular importance to suppress change of thermal expansion coefficient at temperatures around Tg.

In order to elevate reliability against solder reflow and change of environmental temperature, it is necessary to prevent swelling and cracking in a moistened condition and to suppress deformation of the substrate when pressure is exerted locally to the substrate in forming metal/metal connections by wiring bonding at high temperatures exceeding Tg. This calls for curbing of reduction of elastic modulus of the resin at high temperatures. It is particularly important to restrain change of elastic modulus at temperatures around Tg. For restraining variation of such specificities due to change of temperature, usually a method is employed in which fillers of 3–5 $\mu$m to 10 nm in size are added to the resin. With this method, however, it is impossible to curb the change of properties of the resin itself, so that the filler-incorporated resin is subject to the same change of properties as the single resin would suffer. For restraining change of resin properties due to temperature change, it is considered imperative to add a material that suffers little change of properties with temperature change at the molecular level.

The present invention provides novel techniques for minimizing the change of resin quality on change of temperature, according to which the $SiO_2$ skeleton, which is small in change of properties with temperature change and stable in dynamic properties, is uniformly formed at the molecular level and bound to the resin by incorporating a functional group which is covalently bonded to the terminal of the $SiO_2$ skeleton together with the resin.

Further, in the resin curing process according to the present invention, it is important to suppress the formation of by-products for preventing swelling at the resin/base interface or cracking. Use of a polyaddition thermosetting resin in the present invention is intended to eliminate the formation of by-products during curing of the resin. Also, addition of a silane compound and water to the polyaddition thermosetting resin and prosecution of a heat treatment before adding a curing agent to the mixed solution is designed to suppress the formation of water or alcohols, which may be generated as by-products, before effecting heat curing of the resin.

The thermosetting resin composition of the present invention comprises (A) a polyaddition thermosetting resin, (B) a silicic compound (oligomer) represented by the formula (1) or (2):

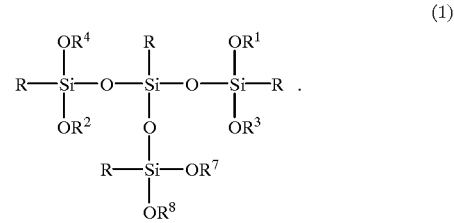

(1)

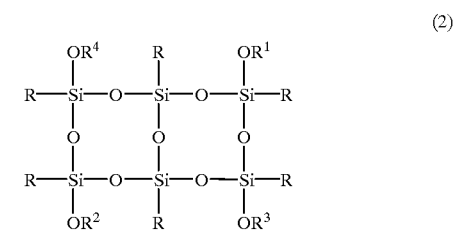

(2)

wherein R is an organic group containing a functional group which causes an addition reaction with the curing agent of said polyaddition thermosetting resin, and $R^1, R^2, R^3, R^4, R^7$ and $R^8$ are each a silicic group of the formula: $Si_nR_nO_m(OH)_j(OR')_k$, wherein R' is methyl or ethyl, and when n is zero, $R^1, R^2, R^3, R^4, R^7$ and $R^8$ are independently hydrogen, methyl or ethyl, and when n is 1,2 or 3, j is an integer of zero to 2n, k is an integer of 0 to 2n and m+j+k=6, and (C) a curing agent of the resin (A).

The thermosetting resin composition of this invention can be used for all types of thermosetting resin molded articles as this composition is low in viscosity before heat cured. When water is added to said polyaddition thermosetting resin and said silicic compound (the amount of water added being preferably 3 to 0.02 times the molar quantity of the silicic compound) and, after heating, a curing resin is further added thereto and heated, the cured resin turns out high in heat resistance and small in difference in thermal expansion coefficient between room temperature and high temperatures, so that the produced resin composition is protective against generation of thermal stress and cracking. Further, since the resin is capable of maintaining a high modulus of elasticity even at high temperatures, the molded articles thereof are resistant to deformation under load of an external force. Moreover, as the formation of by-products such as water and alcohols is restrained during curing of the resin, a composite material made of the resin with a base material such as a metal, ceramic material or other resin remains safe from swelling at the interface between the resin and the base, and the molded articles thereof are proof against crack or exfoliation.

The integral value of the peak at −53 to −72 ppm in the $^{29}$Si-NMR chemical shift in the cured thermosetting resin composition is one to 50 times that of the peak at −40 to −52 ppm. This signifies an increase of molecular weight as a result of the formation of Si—O—Si bonds in the silicic compound, but since the polyaddition thermosetting resin monomer exists as a solvent with good compatibility, the liquid of the thermosetting resin composition is low in viscosity, free of solid particles and transparent.

It is also envisaged in the present invention to provide a process for producing said thermosetting resin composition, comprising the steps of carrying out a heat treatment, at 60 to 160° C. for one to 10 hours, of a mixture consisting of (A) a polyaddition thermosetting resin, (B) a silicic compound of the following formula:

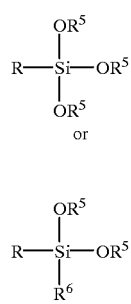

(wherein R is an organic group containing a functional group which causes an addition reaction with the said curing agent; and $R^5$ and $R^6$ are each a methyl or ethyl group) and (D) water, and adding a polyaddition thermosetting resin curing agent (C) to the heat treated mixture. The amount of water in the mixture is preferably 3 to 0.02 moles per mole of the silicic compound.

According to the process of the present invention, since a mixture of a polyaddition thermosetting resin, a silicic compound and water is subjected to a heat treatment before adding a curing agent, the cured thermosetting resin composition is high in heat resistance and small in change of modulus of elasticity at high temperatures, so that its molded articles are resistant to the generation of thermal stress and cracking. Further, since the composition is capable of maintaining high modulus of elasticity even at high temperatures, the molded articles are kept safe from deformation under load of external forces. Still further, since the formation of by-products such as water and alcohols during curing is very slight, a composite material made of the resin with a base such as a metal, ceramic material or other resin is free from swelling at the base/resin interface, and its molded articles are proof against crack and exfoliation. It is also remarkable that the thermosetting resin composition of the present invention can be used for all types of thermosetting resin molded articles as the composition is low in viscosity before heat cured.

The term "polyaddition thermosetting resins" used in the present invention refers to the resins which are three-dimensionally crosslinked and solidified on heating. Examples of such resins include epoxy resins, phenol resins, melamine resins, urea resins, poly-p-hydroxystyrene resins, monomers or oligomers having at least one N-substituted unsaturated imide group, and polyurethane resins. Of these resins, the epoxy resins, mono-, bis-, tri- or tetra-N-substituted maleimide compounds and their derivatives are preferred.

The epoxy resins usable in the present invention are not limited; it is possible to use those known in the art. They include, to cite some examples, bisphenol A epoxy resins, bisphenol F epoxy resins, novolak epoxy resins, glycidylamine-based epoxy resins, and alicyclic epoxy resins.

In case of using an epoxy resin, there can be used as its curing agent any of the known compounds commonly employed for this purpose. Examples of the curing agents usable here include carboxylic acid anhydrides, primary, secondary and tertiary amine compounds, quaternary ammonium salts, dicyandiamides, boron trifluoride-amine complex, organic acid dihydrazides, the compounds having their basic skeleton composed of phenol, cresol and xylynol, their derivatives and polycondensates, and thiol-based compounds. An appropriate one of these curing agents is selected according to the purpose of use of the composition.

The composition of the present invention may contain one or more known curing accelerators, release agents, coupling agents, colorants, plasticizers, diluents, inorganic fillers, flexibilizers, various types of rubber-like materials, photo-sensitizers and the like according to the purpose of use of the composition. Examples of the N-substituted maleimide compounds usable in the present invention include phenylmaleimide, 4,4-diphenylmethanebismaleimide, 4,4-diphenylsulfidobismaleimide, 4,4-diphenylpropanebismaleimide, 4,4-diphenylhexafluoropropanebismaleimide, and 2,2-bis[4-(4-maleimidophenoxy)phenyl]propane.

Spherical silica and crystalline silica can be cited as a typical example of the inorganic fillers usable in the present invention.

Preferred examples of the silicic compounds of the formula (3) include those having a polyaddition functional group represented by any one of the following formulae (5) to (14):

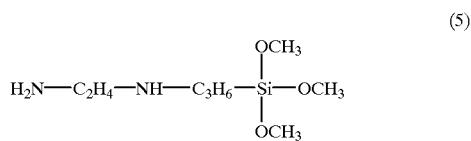

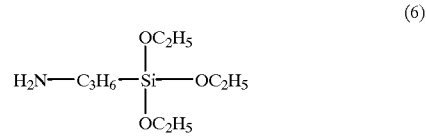

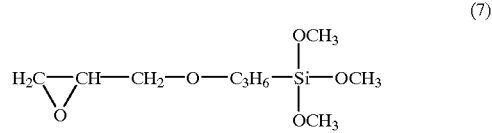

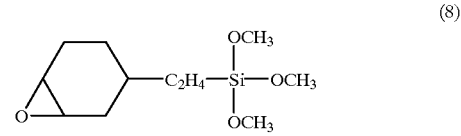

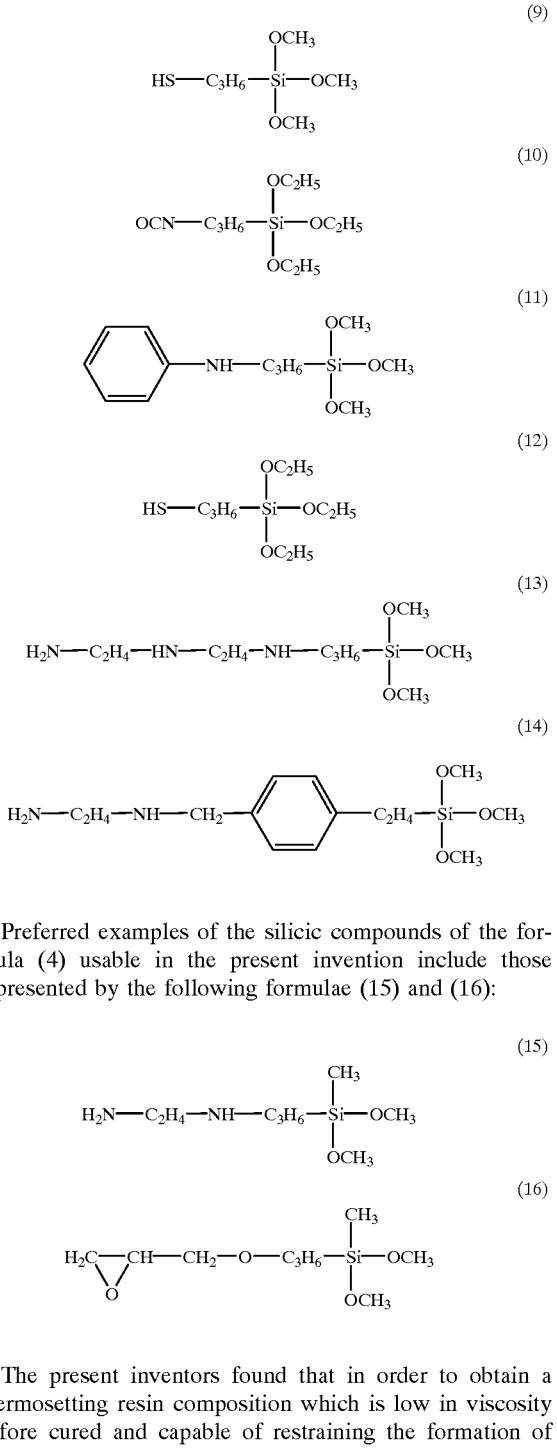

(9)

(10)

(11)

(12)

(13)

(14)

Preferred examples of the silicic compounds of the formula (4) usable in the present invention include those represented by the following formulae (15) and (16):

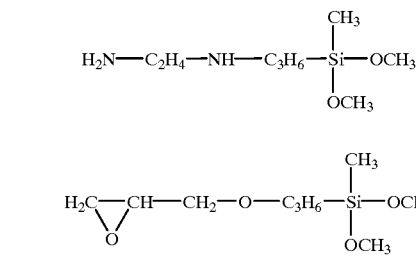

(15)

(16)

The present inventors found that in order to obtain a thermosetting resin composition which is low in viscosity before cured and capable of restraining the formation of by-products such as water and alcohols in the curing reaction, it is expedient to carry out a heat treatment on a mixture of a polyaddition thermosetting resin, a silicic compound and water, with no curing agent contained. The silicic compound used here is the one having a functional group which causes an addition reaction with the polyaddition resin curing agent.

It was confirmed from the $^{29}$Si-NMR chemical shift that such a heat treatment facilitates the formation of an oligomeric silicic compound with high dispersibility among the polyaddition functional groups.

In the $^{29}$Si-NMR chemical shift of a monomer of a silicic compound of the formula:

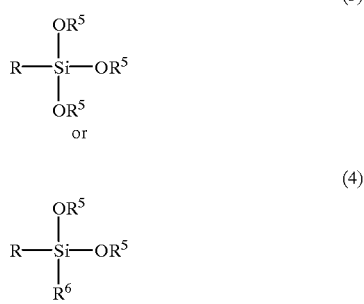

(3)

(4)

wherein R is an organic group containing a functional group which causes an addition reaction with the polyaddition thermosetting resin curing agent, and $R^5$ and $R^6$ are each a methyl or ethyl group), absorption appears at −41 to −44 ppm.

In the $^{29}$Si-NMR chemical shift of Si having one —O—Si bond shown by the following formula (17):

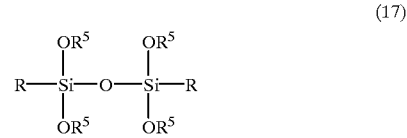

(17)

absorption appears at −48 to −52 ppm.

In the $^{29}$Si-NMR chemical shift of Si having two —O—Si bonds shown by the following formula (18):

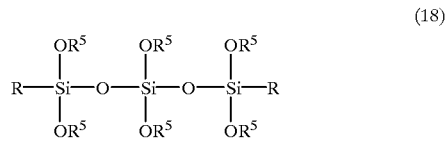

(18)

absorption appears at −53 to −63 ppm.

In the $^{29}$Si-NMR chemical shift of Si having three —O—Si bonds shown by the following formula (19):

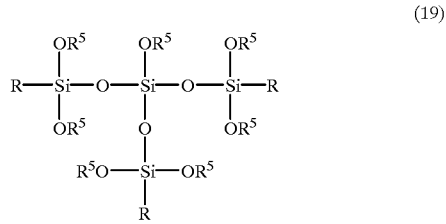

(19)

absorption appears at −63 to −72 ppm.

In the $^{29}$Si-NMR chemical shift of the resin which has been heat cured by adding a curing agent to the thermosetting resin composition of the present invention, absorption appears at −40 to −75 ppm. In view of the fact that the integral value of the absorption in the region of −53 to −75 ppm is greater than that of the absorption in the region of −40 to −52 ppm, it was determined that the silicic compound in the resin was comprised of the molecules forming Si—O—Si bonds and having a size of the oligomer order. Thus, even if the molecular weight of the silicic compound is increased, the thermosetting resin composition before cured is low in viscosity, free from solid particles and transparent since a polyaddition thermosetting resin monomer exists as a solvent with good compatibility.

In case a heat treatment is carried out by adding water to a silicic compound of the formula (3) or (4) without mixing it with a polyaddition thermosetting resin, unlike the thermosetting resin composition of the present invention in which a heat treatment was conducted on a mixture of a polyaddition thermosetting resin, a silicic compound and water with no curing agent contained, no polyaddition thermosetting resin monomer is formed and the silicic compound is solidified or reduced into a high-viscosity solution of not less than 10,000 poises, so that when it is tried to mix the compound with a polyaddition thermosetting resin after said heat treatment, it is impossible to effect uniform mixing at the molecular level.

The present invention is further illustrated by the following examples.

EXAMPLE 1

In this Example, there were used 3-glycidoxypropyltrimethoxysilane (produced by Chisso Corp.) as silicic compound, dibutyltin(IV) dilaurate (produced by Wako Pure Chemical Industries, Ltd.) as catalyst for hydrolysis, an epoxy resin Epikote EP828 (produced by Yuka-Shell Epoxy KK) as polyaddition thermosetting resin, and meta-phenylenediamine (produced by Wako Pure Chemical Industries, Ltd.) as polyaddition thermosetting resin curing agent.

FIG. 1 is a block diagram showing the production process of the thermosetting resin composition according to the instant embodiment of the present invention, which comprises the following steps:

(1) 2.2 g of water and 2.2 g of tin dibutyldilaurate were added to 225 g of 3-glycidoxytrimethoxysilane, and after stirring, the mixed liquid was allowed to stand at room temperature for over one day.

(2) 190 g of an epoxy resin Epikote 828 was added to the mixed liquid of (1) and stirred.

(3) The mixed liquid of (2) was heat treated at 150° C. for 2 hours.

(4) After cooling the heat treated mixed liquid to room temperature, 47 g of methaphenylenediamine was added and stirred.

The liquid obtained from the treatment of (4) is the thermosetting resin composition of this Example. On heating this solution, the cured resin can be obtained. This solution is low in viscosity and can be cast into a mold for making a molded article.

The dynamic elastic properties of a resin plate obtained from the solution of (4) are explained below. This resin plate was made by heating the liquid of (4) at 80° C. and 20° C. for 4 hours at each temperature for heat curing. By-products such as water and alcohols were scarcely formed throughout the period of heat curing.

A test piece for determining the physical properties (dynamic elastic properties) was made from the above resin plate, and its dynamic elastic properties were determined using PVE Rheospectra apparatus mfd. by Rheology Co., Ltd., under the following conditions: heating rate=2° C./min; frequency=10 Hz; chuck interval=20 mm; displacement amplitude=2 $\mu$m. The glass transition temperature (Tg) in the curing reaction, storage elastic modulus at 50° C. and 220° C., weight decrement in the curing reaction, integral value of the peak in the $^{29}$Si-NMR chemical shift, and average number of the recurring units of $(SiRO_{3/2})$ of $R^1$, $R^2$, $R^3$, $R^4$, $R^7$ and $R^8$ in the formula (1) are shown in Table 1.

TABLE 1

|  | Example 1 | Example 2 | Example 3 | Example 4 |
| --- | --- | --- | --- | --- |
| Epoxy resin | Epikote 828 190 g | Epikote 806 157 g | CY179 136 g | D.E.R.332 175 g |
| Curing agent | Methaphenylenediamine 47 g | Tetraethylenepentamine 6.0 g | MHACP 270 g | HN5500 284 g |
| Silicic compound | 3-glycidoxypropyltrimethoxysilane 225 g | N-(2-aminoethyl)-3-aminopropyltrimethoxysilane 55.7 g | 2-(3,4-epoxycyclohexyl)-ethyltrimethoxysilane 169 g | 3-glycidoxypropyltrimethoxysilane 207 g |
| Amount of tin dibutyldilaurate added | 2.2 g | — | 1.7 g | 2.1 g |
| Amount of water added | 4.4 g | 0.6 g | 16.9 g | 20.7 g |
| Curing accelerator | — | — | Cure-sol CN 0.7 g | Cure-sol CN 0.9 g |
| Heat treating conditions | 150° C. - 2 h | 80° C. - 4 h | 150° C. - 4 h | 150° C. - 4 h |
| Curing conditions | 80° C. - 4 h 200° C. - 4 h | 80° C. - 4 h 180° C. - 4 h | 80° C. - 4 h 160° C. - 4 h | 80° C. - 4 h 175° C. - 4 h |
| Decrement of weight in curing reaction | 0.07% | 0.61% | 0.05% | 0.05% |
| Glass transition temperature (Tg) | 190° C. | 180° C. | 150° C. | 160° C. |
| Storage elastic modulus (50° C.) | 2 GPa | 2 GPa | 2 GPa | 2 GPa |
| Storage elastic modulus (220° C.) | 0.8 GPa | 0.6 GPa | 0.3 GPa | 0.4 GPa |
| Bending strength (20° C.) | 110 MPa | 100 MPa | 130 MPa | 130 MPa |

TABLE 1-continued

|  | Example 1 | Example 2 | Example 3 | Example 4 |
|---|---|---|---|---|
| Bending strength (220° C.) | 45 MPa | 60 MPa | 35 MPa | 40 MPa |
| Adhesive strength (50° C.) | 400 g/cm | 300 g/cm | 450 g/cm | 500 g/cm |
| Adhesive strength (220° C.) | 200 g/cm | 180 g/cm | 150 g/cm | 220 g/cm |
| Thermal expansion coefficient (50° C.) | $7.2 \times 10^{-5}$/K | $7.6 \times 10^{-5}$/K | $8.2 \times 10^{-5}$/K | $8.4 \times 10^{-5}$/K |
| Thermal expansion coefficient (220° C.) | $1.2 \times 10^{-4}$/K | $1.4 \times 10^{-4}$/K | $1.2 \times 10^{-4}$/K | $1.2 \times 10^{-4}$/K |
| Ratio of integral values in $^{29}$Si-NMR | 6.9 | 5.2 | 8.2 | 9.6 |
| Average number of recurring units of $(SiRO_{3/2})$ of $R^1$, $R^2$, $R^3$, $R^4$, $R^7$ in formula (1) | 0.9 | 0.6 | 1.2 | 1.4 |

Regarding the storage elastic modulus, bending strength and adhesive strength of the cured product of the thermosetting resin composition of the instant Example, it is noted that the decrement of their values at 220° C., which is higher than Tg, is confined to less than ⅓ of the values at room temperature, which demonstrates high heat stability of the composition at high temperatures.

The integral value of the peak at −53 to −72 ppm in the $^{29}$Si-NMR chemical shift of the cured product of the composition was 6.9 times that of the peak at −40 to −52 ppm, which indicates that the silicic compound was comprised of the molecules of the oligomer level.

EXAMPLE 2

A thermosetting resin composition was produced according to the following process using N-(2-aminoethyl)-3-aminopropyltrimethoxysilane (produced by Chisso Corp.) as silane compound, Epikote EP806 (produced by Yuka-Shell Epoxy KK) as polyaddition thermosetting resin, and tetraethylenepentamine (produced by Wako Pure Chemical Industries Co., Ltd.) as polyaddition thermosetting resin curing agent.

(1) 0.6 g of water was added to 55.7 g of N-(2-aminoethyl)-3-aminopropyltrimethoxysilane, and after stirring, the liquid was allowed to stand at room temperature for over one day.

(2) 167 g of Epikote EP806 was added to the mixed liquid of and stirred.

(3) The mixed liquid of (2) was heat treated at 80° C. for 4 hours.

The liquid obtained on cooling the heat treated liquid of (3) to room temperature is the thermosetting resin composition of this Example. On heating this liquid, the cured resin can be obtained. This liquid is low in viscosity and can be cast into a mold for obtaining a molded article.

The dynamic elastic properties of a resin plate obtained from the liquid of (3) are explained below. The resin plate was made by heating the liquid of (3) at 80° C. and 180° C. for 4 hours at each temperature for heat curing. There were scarcely formed the by-products such as water and alcohols throughout the period of heat curing.

The dynamic elastic properties of this resin plate were determined in the same way as in Example 1. Tg at the time of determination, storage elastic modulus at 50° C. and 220° C., weight decrement in the curing reaction, integral value of the peak in $^{29}$Si-NMR chemical shift and average number of the recurring units of $(SiRO_{3/2})$ of $R^1$, $R^2$, $R^3$, $R^4$, $R^7$ and $R^8$ in the formula (1) are shown in Table 1.

Regarding storage elastic modulus, bending strength and adhesive strength of the cured product of the thermosetting resin composition of this Example, it is noted that the decrement of their values at 220° C., which is above Tg, was less than ¼ of the values at room temperature, demonstrating high heat stability of the composition at high temperatures.

The integral value of the peak at −53 to −72 ppm in the $^{29}$Si-NMR chemical shift of the cured product of the thermosetting resin composition was 5.2 times that of the peak at −40 to −52 ppm, indicating that the silicic compound was comprised of the molecules of the oligomer level.

EXAMPLE 3

In this Example, a thermosetting resin composition was produced in the following way using 2-(3,4-epoxycyclohexyl)ethyltrimethoxysilane (produced by Chisso Corp.) as silicic compound, tin dibutyldilaurate (produced by Wako Pure Chemical Industries, Ltd.) as catalyst for hydrolysis, an epoxy resin CY179 (produced by Nippon Ciba-Geigy Co.) as polyaddition thermosetting resin, MHACP (produced by Hitachi Chemical Company, Ltd.) as polyaddition thermosetting resin curing agent, and an imidazole-based compound Cure-sol CN (produced by Shikoku Chemicals Corp.) as curing accelerator.

(1) 16.9 g of water and 1.7 g of tin dibutyldilaurate were added to 169 g of 2-(3,4-epoxycyclohexyl) ethyltrimethoxysilane, and after stirring, the mixture was allowed to stand at room temperature for over one day.

(2) 136 g of an epoxy resin CY179 was added to the mixed liquid of (1) and stirred.

(3) The mixed liquid of (3) was heat treated at 150° C. for 4 hours.

(4) After cooling the heat treated liquid to room temperature, 270 g of MHACP was added to the liquid and stirred.

The liquid formed in (4) is the thermosetting resin composition of this Example. On heating this liquid, the cured resin can be obtained. This liquid is low in viscosity and can be cast into a mold for forming a molded article.

The dynamic elastic properties of a resin plate obtained from the liquid of (4) are explained below. The resin plate was made by heating the liquid of (4) at 80° C. and 160° C. for 5 hours at each temperature for heat curing. In the curing operation, there were scarcely formed the by-products such as water and alcohols.

The dynamic elastic properties of this resin plate were determined in the same way as in Example 1. The results, i.e. Tg of the resin plate, its storage elastic modulus at 50° C. and 220° C., weight decrement in the curing reaction, integral value of the peak in the $^{29}$Si-NMR chemical shift, and average number of the recurring units of $(SiO_{3/2})$ of $R^1$, $R^2$, $R^3$, $R^4$, $R^7$ and $R^8$ in the formula (1) are shown in Table 1.

Regarding the storage elastic modulus, bending strength and adhesive strength of the cured product of the thermosetting resin composition of this Example, it is noted that the decrement of their values at 220° C., which is above Tg, is confined to less than 1/7 of the values at room temperature, which demonstrates high heat stability of the composition at high temperatures.

The integral value of the peak at −53 to −72 ppm in the $^{29}$Si-NMR chemical shift of the cured product of the thermosetting resin composition was 8.2 times that of the peak at −40 to −52 ppm, indicating that the silicic compound was comprised of the molecules of the oligomer level.

EXAMPLE 4

A thermosetting resin composition was produced according to the following method using 3-glycidoxypropyltriethoxysilane (produced by Chisso Corp.) as silane compound, tin dibutyldilaurate (produced by Wako Pure Chemical Industires, Ltd.) as catalyst for hydrolysis, an epoxy resin D.E.R.332 (produced by Dow Chemical Japan) as polyaddition thermosetting resin, an acid anhydride curative for epoxy resin HN5500 (produced by Hitachi Chemical Company, Ltd.) as polyaddition thermosetting resin curing agent, and an imidazole-based compound Cure-sol CN (produced by Shikoku Chemicals Corp.) as curing accelerator.

(1) 20.7 g of water and 2.1 g of tin dibutyldilaurate were added to 207 g of 3-glycidoxypropyltriethoxysilane, and after stirring, the mixture was allowed to stand at room temperature for one day or more.

(2) 175 g of an epoxy resin D.E.R.332 was added to the mixed liquid of (1) and stirred.

(3) The mixed liquid of (2) was heat treated at 150° C. for 4 hours.

(4) After cooling the heat treated liquid to room temperature, 284 g of HN5500 was added and stirred.

The liquid obtained in (4) is the thermosetting resin composition of this Example. On heating this liquid, the cured resin can be obtained. This liquid is low in viscosity can cast into a mold for forming a molded article.

The dynamic elastic properties of a resin plate obtained from the liquid of (4) are explained. The resin plate was made by heating the liquid of (4) at 80° C. and 175° C. for 4 hours at each temperature for heat curing. During the curing operation, there were scarcely formed the by-products such as water and alcohols.

The dynamic elastic properties of this resin plate were determined in the same way as in Example 1. The results, i.e. Tg of the resin plate, its dynamic elastic modulus at 50° C. and 220° C., weight decrement in the curing reaction, integral value of the peak in the $^{29}$Si-NMR chemical shift and average number of the recurring units of $(SiO_{3/2})$ of $R^1$, $R^2$, $R^3$, $R^4$, $R^7$ and $R^8$ in the formula (1) are shown in Table 1.

Regarding the storage elastic modulus, bending strength and adhesive strength of the cured product of the thermosetting resin composition of this Example, it is noted that the decrement of their values at 220° C., which is above Tg, is confined to less than 1/5 of the values at room temperature, which demonstrates high heat stability of the composition at high temperatures.

The integral value of the peak at −53 to −72 ppm in the $^{29}$Si-NMR chemical shift of the cured product of the thermosetting resin composition was 9.6 times that of the peak at −40 to −52 ppm, indicating that the silicic compound was comprised of the molecules at the oligomer level.

The cured products of the thermosetting resin compositions of Examples 1 to 4 are high in heat resistance and small in change of elastic modulus at high temperatures, so that they are resistant to the generation of thermal stress and cracking. Also, when these compositions are cured, there are scarcely formed the by-products such as water and alcohols, so that when they are made into composite materials with a base material such a metal, ceramic material or other resin, no swelling takes place at the base/resin interface and the molded articles remain free of cracks and exfoliation.

Further, since the thermosetting resin compositions of Examples 1 to 4 are low in viscosity before heat cured (1 to 20 P at room temperature), they can be used for all types of thermosetting resin molded articles.

In application to the semiconductor devices, said compositions can be used not only as a covering material or encapsulant, but can also be applied to semiconductor element protective members, insulating films, stress-relieving materials and such. Also, since the composite material is resistant to cracking and the generation of thermal stress at the interfaces and allows the semiconductor devices to operate correctly after solder reflow at 260° C. and in the −50/150° C. heat cycle, the reliability of the semiconductor devices is enhanced.

In use of the composition for the printed circuit substrates, prepregs and the like, it is possible to restrain deformation of the multilayer printed circuit substrates even in treatment with a solder bath of higher than 260° C. It is also possible to prevent swelling or cracking in the inside of the molded article even when exposed to a −50/150° C. heat cycle.

In application to the automobile parts, the composition makes the parts resistant to deformation even when subjected to a heat shock at temperatures from −40° C. to 140° C. and also chemically stable against salinity in the environment, oils, battery liquid and other matters, so that the service life of the parts is elongated.

Comparative Examples 1–4

The resin plates were made by heat curing the epoxy resins Epikote EP828 (produced by Yuka-Shell Epoxy KK), Epikote EP806 (produced by Yuka-Shell Epoxy KK), CY179 (produced by Nippon Ciba-Geigy Co.) and D.E.R.332 (produced by Dow Chemical Japan), using their curing agents methaphenylenediamine (produced by Wako Pure Chemical Industries, Ltd.), tetraethylenepentamine (produced by Wako Pure Chemical Industries, Ltd.), MHACP (produced by Hitachi Chemical Company, Ltd.) and HN5500 (Hitachi Chemical Company, Ltd.) for the respective resins and also using, if necessary, a curing accelerator Cure-sol CN (produced by Shikoku Chemicals Corp.), under the curing conditions shown in Table 2, and the dynamic elastic properties of these resin plates were determined in the same way as in Example 1. Tg of the resin plates and their storage elastic moduli at 50° C. and 220° C. are shown in Table 2. It is seen that in Examples 1 to 4 embodying the present invention in comparison with the corresponding Comparative Examples 1 to 4, the storage elastic modulus, bending strength and adhesive strength at 220° C., which is above Tg, are improved more than 10 times their values at room temperature. On the other hand, regarding the storage elastic modulus, bending strength and adhesive strength of the cured products shown in Comparative Examples, it is noted that their values at 220° C., which is above Tg, are reduced by nearly two figures as compared with the values at room temperature.

ethyltrimethoxysilane, and after stirring, the mixed liquid was allowed to stand at room temperature for over one day.

(2) 169 g of a trifunctional epoxy resin 1032H60 was added to the mixed liquid of (1) and stirred.

(3) The mixed liquid of (2) was heat treated at different temperatures, viz. at 60° C. for 2 and 4 hours, at 80° C. for 1 and 10 hours, at 120° C. for 1 and 10 hours, and at 160° C. for 2 and 4 hours, thus forming 8 samples of liquid.

(4) After cooling each sample of the heat treated liquid to room temperature, 352 g of MHACP and 0.8 g of Cure-sol CN were added and stirred.

The liquids obtained in (4) are the thermosetting resin compositions of the Comparative Examples 1 to 4. On heating these preparations, the cured resins can be obtained.

With reference to the respective cases where the heat treatment was conducted at 60° C. for 2 or 4 hours, at 80 for 1 or 10 hours, at 120° C. for 1 or 10 hours and at 160° C.

TABLE 2

|  | Comp. Example 1 | Comp. Example 2 | Comp. Example 3 | Comp. Example 4 |
| --- | --- | --- | --- | --- |
| Epoxy resin | Epikote 828 | Epikote 806 | CY179 | D.E.R.332 |
|  | 190 g | 167 g | 136 g | 175 g |
| Curing agent | Methaphenylene-diamine | Tetraethylene-pentamine | MHACP | HN5500 |
|  | 24 g | 24 g | 160 g | 152 g |
| Curing accelerator | — | — | Cure-sol CN 0.7 g | Cure-sol CN 0.9 g |
| Curing conditions | 80° C. - 4 h | 80° C. - 4 h | 80° C. - 4 h | 80° C. - 4 h |
|  | 200° C. - 4 h | 180° C. - 4 h | 160° C. - 5 h | 175° C. - 4 h |
| Glass transition temperature (Tg) | 180° C. | 140° C. | 150° C. | 160° C. |
| Storage elastic modulus (50° C.) | 2 GPa | 2 GPa | 2 GPa | 2 GPa |
| Storage elastic modulus (220° C.) | 0.06 GPa | 0.03 GPa | 0.03 GPa | 0.03 GPa |
| Bending strength (20° C.) | 120 MPa | 110 MPa | 140 MPa | 140 MPa |
| Bending strength (220° C.) | 3 MPa | 2 MPa | 2 MPa | 2 MPa |
| Adhesive strength (20° C.) | 380 g/cm | 250 g/cm | 400 g/cm | 430 g/cm |
| Adhesive strength (220° C.) | 10 g/cm | 10 g/cm | 10 g/cm | 10 g/cm |
| Thermal expansion coefficient (50° C.) | $6.3 \times 10^{-5}$/K | $6.5 \times 10^{-5}$/K | $7.1 \times 10^{-5}$/K | $7.0 \times 10^{-5}$/K |
| Thermal expansion coefficient (220° C.) | $1.7 \times 10^{-4}$/K | $1.8 \times 10^{-4}$/K | $2.5 \times 10^{-4}$/K | $1.8 \times 10^{-4}$/K |

EXAMPLE 5

In this Example, a thermosetting resin composition was produced according to the following process using 2-(3-epoxycyclohexyl)ethyltrimethoxysilane (produced by Chisso Corp.) as silicic compound, dibutyltin(IV) dilaurate (produced by Wako Pure Chemical Industries, Ltd.) as catalyst for hydrolysis, a polyfunctional epoxy resin 1032H60 (produced by Yuka-Shell Epoxy KK) as polyaddition thermosetting resin, an acid anhydride curative for epoxy resins MHACP (produced by Hitachi Chemical Company, Ltd.) as polyaddition thermosetting resin curing agent, and an imidazole-based compound Cure-sol CN (produced by Shikoku Chemicals Corp.) as curing accelerator.

(1) 15 g of water and 3.0 g of dibutyltin(IV) diluarate were added to 297 g of 2-(3,4-epoxycyclohexyl)- for 2 or 4 hours in (3), the dynamic elastic properties of the resin plates obtained from the liquids of (4) are explained. The resin plates were made from the liquids of (4) by heating at 80° C. and 200° C. for 4 hours at each temperature for heat curing.

The dynamic elastic properties, three-point bending strength and adhesive strength of these resin plates were determined in the same way as in Example 1. The glass transition temperature (Tg) of these resin plates, their storage elastic modulus at 50° C. and 220° C., bending strength, adhesive strength to aluminum, weight decrement in the curing reaction, integral value of the peak in the $^{29}$Si-NMR chemical shift, and average number of the recurring units of (SiRO$_{3/2}$) of $R^1$, $R^2$, $R^3$, $R^4$, $R^7$ and $R^8$ in the formula (1) are shown in Table 3.

TABLE 3

| Heat treating conditions | Comp. Example 5 | | Example 5 | | | | | | | |
|---|---|---|---|---|---|---|---|---|---|---|
| | 40° C.-4 h | 120° C.-0.5 h | 60° C.-4 h | 60° C.-4 h | 80° C.-1 h | 80° C.-10 h | 120° C.-1 h | 120° C.-10 h | 160° C.-2 h | 160° C.-4 h |
| Glass transition temperature (Tg) | 160° C. | 170° C. | 180° C. | 180° C. | 180° C. | 190° C. | 190° C. | 190° C. | 190° C. | 190° C. |
| Decrement of weight in curing reaction | 1.5% | 1.2% | 0.9% | 0.7% | 0.8% | 0.2% | 0.4% | 0.1% | 0.06% | 0.03% |
| Storage elastic modulus (50° C.) | 1 GPa | 2 GPa | 2 GPa | 2 GPa | 2 GPa | 2 GPA | 2 Gpa | 2 GPa | 2 GPa | 2 GPA |
| Storage elastic modulus (220° C.) | 0.08 GPa | 0.15 GPa | 0.3 GPa | 0.4 GPa | 0.3 GPa | 0.7 GPa | 0.4 Gpa | 1.0 GPa | 1.1 GPa | 1.2 GPa |
| Bending strength (20° C.) | 90 MPa | 110 MPa | 120 MPa | 130 MPa | 120 MPa | 150 MPa | 130 MPa | 150 MPa | 150 MPa | 150 MPa |
| Bending strength (220° C.) | 5 MPa | 10 MPa | 15 MPa | 20 MPa | 18 MPa | 35 MPa | 21 MPa | 58 MPa | 60 MPa | 70 MPa |
| Adhesive strength (50° C.) | 600 g/cm | 570 g/cm | 550 g/cm | 510 g/cm | 520 g/cm | 440 g/cm | 480 g/cm | 420 g/cm | 410 g/cm | 400 g/cm |
| Adhesive strength (220° C.) | 20 g/cm | 40 g/cm | 100 g/cm | 120 g/cm | 110 g/cm | 170 g/cm | 140 g/cm | 180 g/cm | 190 g/cm | 200 g/cm |
| Thermal expansion coefficient (50° C.) | $7.3 \times 10^{-5}$/K | $7.5 \times 10^{-5}$/K | $7.7 \times 10^{-5}$/K | $7.8 \times 10^{-5}$/K | $7.7 \times 10^{-5}$/K | $8.0 \times 10^{-5}$/K | $7.9 \times 10^{-5}$/K | $8.3 \times 10^{-5}$/K | $8.4 \times 10^{-5}$/K | $8.4 \times 10^{-5}$/K |
| Thermal expansion coefficient (220° C.) | $1.5 \times 10^{-4}$/K | $1.5 \times 10^{-4}$/K | $1.4 \times 10^{-4}$/K | $1.4 \times 10^{-4}$/K | $1.4 \times 10^{-4}$/K | $1.3 \times 10^{-4}$/K | $1.3 \times 10^{-4}$/K | $1.2 \times 10^{-4}$/K | $1.2 \times 10^{-4}$/K | $1.2 \times 10^{-4}$/K |
| Ratio of integral values in $^{29}$Si—NMR | 0.6 | 0.9 | 2.8 | 3.0 | 2.9 | 6.5 | 4.8 | 13 | 13 | 15 |
| Average number of recurring units of (SiRO$_{3/2}$) of $R^1$, $R^2$, $R^3$, $R^4$, $R^7$ and $R^8$ in formula (1) | 0.1 | 0.1 | 0.2 | 0.4 | 0.3 | 0.9 | 0.7 | 1.8 | 1.9 | 2.1 |

The cured products of the thermosetting resin compositions obtained according to the process of this Example are greatly improved in their properties by conducting a heat treatment at 60° C. for 2 or 4 hours, at 80° C. for 1 or 10 hours, at 120° C. for 1 or 10 hours, and at 160° C. for 2 or 4 hours. That is, regarding the storage elastic modulus, bending strength and adhesive strength of the cured products, it is noted that the decrement of their values at 220° C., which is above Tg, is confined to less than 1/10 of the values at room temperature, which demonstrates high heat stability of the said cured products at high temperatures. The integral value of the peak at −53 to −72 ppm in the $^{29}$Si-NMR chemical shift of the cured products of the thermosetting resin compositions obtained in this Example was 2.8 to 15 times the value of the peak at −40 to −52 ppm, indicating that the silicic compound was comprised of the molecules of the oligomer level.

Comparative Example 5

The thermosetting resin compositions were produced according to the following process using 2-(3,4-epoxycyclohexyl)ethyltrimethoxysilane (produced by Chisso Corp.) as silicic compound, dibutyltin(IV) dilaurate (produced by Wako Pure Chemical Industries, Ltd.) as catalyst for hydrolysis, a polyfunctional epoxy resin 1032H60 (produced by Yuka-Shell Epoxy KK) as polyaddition thermosetting resin, an acid anhydride curative for epoxy resins MHACP (produced by Hitachi Chemical Company, Ltd.) as polyaddition thermosetting resin curing agent, and an imidazole-based compound Cure-sol CN (produced by Shikoku Chemicals Corp.) as curing accelerator. (1) 15 g of water and 3.0 g of dibutyltin(IV) dilaurate were added to 297 g of 2-(3,4-epoxycyclohexyl)-ethyltrimethoxysilane, and after stirring, the mixed liquid was allowed to stand at room temperature for over one day.
 (2) 169 g of a polyfunctional epoxy resin 1032H60 was added to the mixed liquid of (1).
 (3) The mixed liquid of (2) was heat treated for different periods, viz. for 4 hours at 40° C. and 180° C. and for 0.5 and 12 hours at 120° C.
 (4) After cooling each sample of the heat treated liquid to room temperature, 35 g of MHACP and 0.8 g of Cure-sol CN were added and stirred.

On heating the liquid of (4), the cured resin can be obtained.

The difference in dynamic elastic properties of the resin obtained from the liquid of (4) between the case where the heat treatment was conducted at 40° C. for 4 hours and the case where the heat treatment was conducted at 120t for 0.5 hour is explained. The resin plates were made by heating the liquids of (4), which have undergone the above-said respective heat treatments, at 80° C. and 200° C. for 4 hours for heat curing. In case the heat treatment was conducted at 180° C. for 4 hours and at 120° C. for 12 hours, the liquid obtained in (3) was high in viscosity and the liquid obtained in (4) didn't become homogeneous, so that the production of the resin plate was abandoned in these cases. In case the heat treatment was conducted at 40° C. for 4 hours and at 120° C. for 0.5 hour, water was seen to form as a by-product in curing of the liquid of (4).

The dynamic elastic properties, three-point bending strength and adhesive strength of the resin plates obtained after the heat treatment at 40° C. for 4 hours and at 120° C. for 0.5 hour were determined in the same way as in Example 1. The glass transition temperature (Tg) of these resin plates, their storage elastic modulus at 50° C. and 220° C., bending strength and adhesive strength to aluminum, weight decrement in the curing reaction, integral value of the peak in the $^{29}$Si-NMR chemical shift and average number of the recurring units of (SiRO$_{3/2}$) of $R^1$, $R^2$, $R^3$, and $R^4$, $R^7$ and $R^8$ in the formula (1) are shown in Table 3.

As a result, it was found that in the case of the heat cured products subjected to the heat treatment at 40° C. for 4 hours and at 120° C. for 0.5 hour, which are the conditions that allowed obtainment of the cured products of the thermosetting resin compositions in this Comparative Example, the measured values of storage elastic modulus, bending strength and adhesive strength of the said cured products (resin plates) at 220° C., which is above Tg, were all less than ½ of those in Example 5 of the present invention. Also, the weight decrement in the curing reaction in Comparative Example 5 was more than twice that in Example 5, and the reaction was accompanied by heavy formation of the by-products.

The integral value of the peak at −53 to −72 ppm in the $^{29}$Si-NMR chemical shift of the cured products of the thermosetting resin compositions obtained in this Comparative Example was 0.6 to 0.9 times that of the peak at −40 to −52 ppm in case the heat treatment was conducted at 40° C. for 4 hours and at 120° C. for 0.5 hour, indicating that most of the molecules of the silane compound were of the diner to tetramer level. In case the heat treating conditions were 180° C./4 hours and 120° C./12 hours, the integral value of the −53 to −72 ppm peak was 31 times and 25 times, respectively, that of the −40 to −52 ppm peak, indicating that the silane compound was composed of the molecules of the polymer level.

EXAMPLE 6

The silicon chip used in this Example was the one in which the 80 μm-diameter solder bump electrodes were formed at center intervals of 160 μm on the 10×10 mm silicon chip electrode. The circuit substrate comprised a two-layer laminate of glass-reinforced epoxy substrates FR4.

Figure 2:
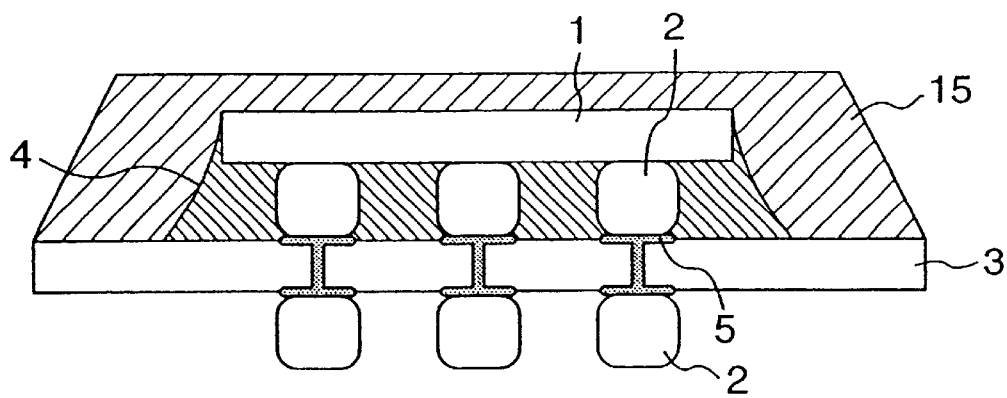
FIG. 2 is a sectional view of the semiconductor device obtained in Example 6 of the present invention.

As shown in FIG. 2, the solder bump electrodes 2 of the bear chip 1 were placed in registration with the corresponding lands 5 of the circuit substrate 3 and solder connected by IR reflow, and then a liquid thermosetting resin composition 4 prepared in the manner described below was filled in the approximately 50 μm space between an electronic part and the circuit substrate 3. Filling was accomplished by applying the thermosetting resin composition 4 by a dispenser to one side of the bear chip 1 with the circuit substrate 3 heated to 60° C., and letting the composition infiltrate into the space by availing of the capillary action over a period of 30 minutes. Then the assembly was heated at 80° C. and successively at 200° C. for 4 hours at each temperature to effect heat curing of the composition, and then encapsulated with a spherical filler-incorporated epoxy-based thermosetting resin 15 to complete a semiconductor device. For the circuit substrate 3, there can be used not only glass-reinforced epoxy and glass-reinforced polyimide resins, but also the thermosetting resin compositions of Examples 1 to 5.

2.2 g of water and 2.2 g of tin dibutyldilaurate (produced by Wako Pure Chemical Industries, Ltd.), which is a catalyst for hydrolysis, were added to 225 g of 3-glycidoxypropyltrimethoxysilane (produced by Chisso Corp.), and after stirring, the mixture was allowed to stand at room temperature for over one day, after which 190 g of a bisphenol A epoxy EP828 (produced by Yuka-Shell Epoxy KK) was added and stirred, and the mixed liquid was heat treated at 80° C. for one hour. After cooling the liquid, 47 g of methaphenylenediamine (produced by Wako Pure Chemical Industries, Ltd.) and spherical silica having an average particle size of 4 μm were added to a concentration of 70 wt %. and stirred.

A heat cycle test, with each cycle consisting of cooling at −50° C. for 10 minutes and heating at 150° C. for 10 minutes, was conducted on five samples of semiconductor device, and each sample was checked for internal cracks of the solder and thermosetting resin composition once every 50 cycles by a supersonic flaw detector. It was found that the addition of a silicic compound and application of the heat treatment prevented development of internal cracks of the solder and thermosetting resin composition even after 3,000 heat cycles, thus elevating the reliability of the device in use under the conditions of this heat cycle test.

Comparative Example 6

A semiconductor device was made in the same way as in Example 6 by adding 190 g of a bisphenol A epoxy EP828 (produced by Yuka-Shell Epoxy KK), 24 g of methaphenylenediamine (produced by Wako Pure Chemical Industries, Ltd.) and spherical silica having an average particle size of 4 μm to a concentration of 70 wt % and stirred the mixture.

The above-said thermal cycle test was conducted on five samples of semiconductor device, and each sample was checked for the internal cracks of the solder and thermosetting resin composition once every 50 cycles by a supersonic flaw detector. Internal cracks of the solder were found in two samples of semiconductor device before reaching the 1,000th cycle, and such internal solder cracks occurred in all of the five samples when the cycle number reached 2,000. In two of these samples of semiconductor device, internal cracks of the thermosetting resin composition were also observed. These facts indicate low reliability of the semiconductor device of this Comparative Example in use under the conditions of the heat cycle test.

EXAMPLE 7

Figure 3:
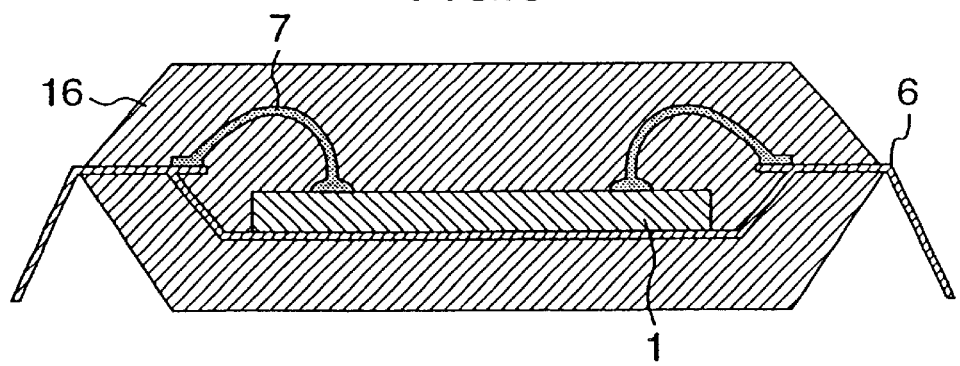
FIG. 3 is a sectional view of the resin encapsulated semiconductor device obtained in Example 7 of the present invention.

A resin-encapsulated semiconductor device for TSOP (thin small outline package) shown in FIG. 3 was manufactured by 50t transfer press (mfd. by Towa Seiki KK) under the conditions of 7 MPa and 180° C. using as encapsulant a thermosetting resin composition 16 prepared in the manner described below. 22.5 g of water and 2.2 g of tin dibutyldilaurate (produced by Wako Pure Chemical Industries, Ltd.), which is a catalyst for hydrolysis, were added to 225 g of 3-glycidoxypropyltrimethoxysilane (produced by Chisso Corp.), and after stirring, the mixture was allowed to stand at room temperature for over one day, after which 190 g of a bisphenol A epoxy EP828 (produced by Yuka-Shell Epoxy KK) was added and stirred. The mixed liquid was heat treated at 150° C. for one hour and after cooling the liquid, 47 g of methaphenylenediamine (produced by Wako Pure Chemical Industries, Ltd.) and spherical silica having an average particle size of 4 μm were added to a concentration of 75 wt % and stirred. The resulting mixture was subjected to a 110° C., 20-minute heat treatment and, after cooling, pulverized to obtain a thermosetting resin composition. To determine reflow resistance, each test piece was left in an environment of 85° C. and 85% RH for 168 hours, allowing the test piece to absorb moisture, and then subjected to a reflow test in which the test piece was dipped in a 260° C. solder bath for 10 seconds and then checked for surface and inside cracks and exfoliation. Surface cracks were examined by visual observation while inside cracks and exfoliation were checked by a supersonic flaw detector. As a result, it was found that the addition of the silicic compound and application of the heat treatment eliminated the possibility of cracking as well as exfoliation at the lead frame 6 interface, thus enhancing the reliability of the device. In FIG. 3, reference numeral 1 indicates a silicon chip and 7 a gold wire. The distance between the underside of the lead frame 6 and the underside of the thermosetting resin composition 16 in the bear chip 1 mounted portion is 0.2 mm.

Comparative Example 7

A semiconductor device was made in the same way as in Example 7, using a thermosetting resin composition prepared by adding 190 g of EP828 (produced by Yuka-Shell Epoxy KK), 24 g of methaphenylenediamine (produced by Wako Pure Chemical Industries, Ltd.) and spherical silica having an average particle size of 4 μm to a concentration of 75 wt %, followed by stirring, then subjecting the mixture to a 110° C., 40-minute heat treatment, and cooling and pulverizing the mixture.

To determine reflow resistance, each test piece was left in an environment of 85° C. and 85% RH for 168 hours, allowing the test piece to absorb moisture, and then subjected to a reflow test in which the test piece was dipped in a 260° C. solder bath for 10 seconds and then checked for surface and internal cracks and exfoliation. Surface cracks were examined by visual observation while internal cracks and exfoliation were checked by a supersonic flaw detector. As a result, in 5 out of 10 samples, there took place exfoliation at the lead frame interface or resin cracks developed on the backside of the semiconductor device where the resin thickness was 0.2 mm.

EXAMPLE 8

The bear chip used in this Example was of the type in which the 80 μm-diameter gold bump electrodes were formed at center intervals of 160 μm on a 10×10 mm silicon chip electrode. A two-layer laminate of glass-reinforced epoxy substrates FR4 was used as circuit substrate.

Figure 4A:
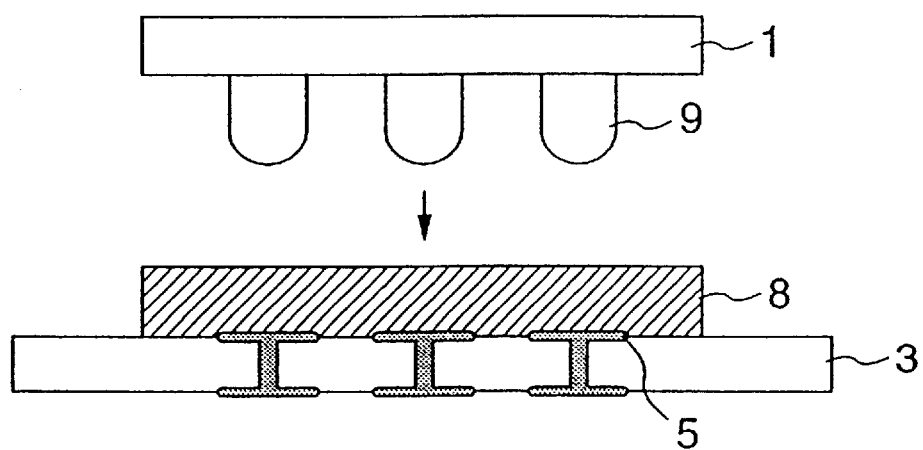
FIGS. 4A and 4B are the sectional views illustrating the production process of the semiconductor device of Example 8 of the present invention.
Figure 4B:
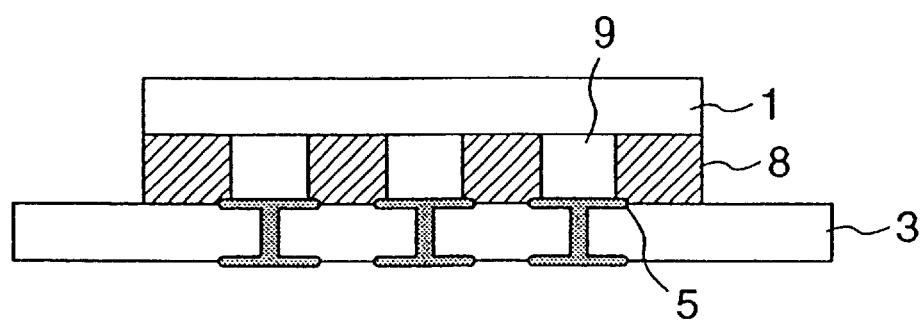

As shown in FIGS. 4A and 4B, a film of thermosetting resin composition 8 prepared in the manner described below was tentatively placed at the position on the circuit substrate 3 where the bear chip 1 was to be disposed, and then the bear chip 1 having the gold bumps 9 was placed on the circuit substrate 3 and heated at 180° C. for 4 hours under a load of 10 kg/cm$^2$ per chip, thereby simultaneously performing electrical connection of the bear chip 1 to the circuit substrate 3 and curing of the 80 to 90 μm-thick film of thermosetting resin composition 8 to complete a semiconductor device using the film of thermosetting resin composition 8 for sealing the space between the bear chip 1 and the circuit substrate 3. The circuit substrate 3 was made of the same material as used in Example 6. In FIGS. 4A and 4B, reference numeral 5 indicates a land.

In preparation of the film of thermosetting resin composition 8, 11.2 g of water and 2.2 g of tin dibutyldilaurate (produced by Wako Pure Chemical Industries, Ltd.), which is a catalyst for hydrolysis, were added to 225 g of 3-glycidoxypropyltrimethoxysilane (produced by Chisso Corp.), and after stirring, the mixture was allowed to stand at room temperature for over one day, after which 190 g of a bisphenol A epoxy EP828 (produced by Yuka-Shell Epoxy KK) was added and stirred. The mixed liquid was heat treated at 120° C. for one hour, and after cooling the liquid, 47 g of methaphenylenediamine (produced by Wako Pure Chemical Industries, Ltd.) and spherical silica having an average particle size of 4 μm were added to a concentration of 70 wt % and stirred, and the resulting mixture was heat treated at 80° C. for 30 minutes.

A heat cycle test comprising 10-minute cooling at –50° C. and 10-minute heating at 150° C. for each cycle was conducted on 5 samples of semiconductor device, and each sample was checked for internal cracks of the solder and the film of thermosetting resin composition by a supersonic flaw detector. It was found that the addition of the silicic compound and application of the heat treatment were effective for preventing internal cracking of the solder and the film of thermosetting resin composition even after passing 3,000 cycles, and elevated reliability of the device in use under the conditions of the heat cycle test.

Comparative Example 8

In the same way as in Example 8, a semiconductor device was made using a film of thermosetting resin composition prepared by adding 190 g of a bisphenol A epoxy EP828 (produced by Yuka-Shell Epoxy KK), 24 g of methaphenylenediamine (produced by Wako Pure Chemical Industries, Ltd.) and spherical silica having an average particle size of 4 μm to a concentration of 70 wt %, stirring the mixture, and heat treating it at 80° C. for 30 minutes.

A heat cycle test comprising 10-minute cooling at –50° C. and 10-minute heating at 150° C. for each cycle was conducted on 5 samples of semiconductor device, and each sample was checked for internal cracks of the solder and the film of thermosetting resin composition by a supersonic flaw detector. As a result, 3 samples of semiconductor device suffered solder cracks in less than 2,000 cycles, and one of these 3 samples also had cracks in the film of thermosetting resin composition. Solder cracks occurred in all of the 5 samples in 3,000 cycles, and four of them had cracks in the film of thermosetting resin composition, too. This indicates low reliability of the semiconductor device of this Comparative Example in use under the conditions of the heat cycle test.

EXAMPLE 9

Figure 5:
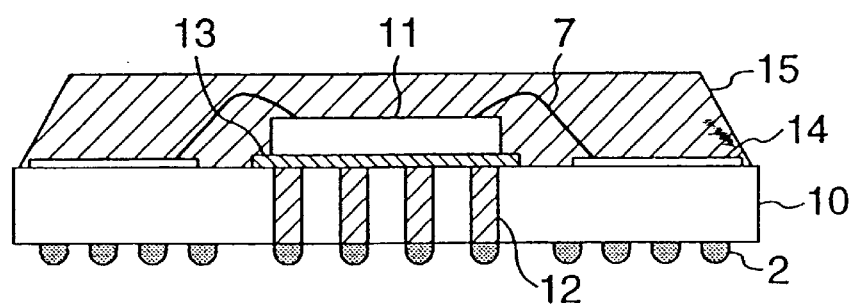
FIG. 5 is a sectional view of the BGA package obtained in Example 9 of the present invention.

A printed circuit substrate for BGA (ball grid array) illustrated in FIG. 5 was made by using 3-glycidoxytrimethoxysilane (produced by Chisso Corp.) as silicic compound, tin dibutyltin(IV) dilaurate (produced by Wako Pure Chemical Industries, Ltd.) as catalyst for hydrolysis, an epoxy resin Epikote EP828 (produced by Yuka-Shell Epoxy KK) as polyaddition thermosetting resin, methaphenylenediamine (produced by Wako Pure Chemical Industries, Ltd.) as polyaddition thermosetting resin curing agent, and 9 μm-sized E glass as glass cloth.

The process for producing the printed circuit substrate for BGA in this Example is explained with reference to FIG. 1.
 (1) 22.5 g of water and 2.2 g of tin dibutyldilaurate were added to 225 g of 3-glycidoxytrimethoxysilane, and after stirring, the mixture was allowed to stand at room temperature for over one day.
 (2) 190 g of an epoxy resin Epikote EP828 was added to the mixed liquid of (1) and stirred.
 (3) The mixed liquid of (3) was heat treated at 150° C. for 4 hours.
 (4) After cooling the heat treated liquid to room temperature, 47 g of methaphenylenediamine was added and stirred. Then the mixture was heat treated at 100° C. for 10 minutes to reduce the resin into a half-molten state, and methyl ethyl ketone was added thereto to prepare a varnish with a resin content of 70 wt %.

A glass cloth was dipped in said varnish, then raised up vertically at such a rate that the volume fraction of the glass cloth after removal of the solvent would become 30 vol %, and introduced into a 150° C. hot-air drying oven to remove the solvent. The thus treated glass cloth was heat cured by heating at 80° C. for 4 hours and then at 180° C. for another 4 hours to make a 27 mm×27 mm×0.2 mm thick printed circuit substrate for BGA.

In order to form thermal via 12 in the central 7 mm×7 mm area of this printed circuit substrate, 0.7 mm through-holes were formed by a drill at a pitch of 1.27 mm. These through-holes were filled up with Cu by Cu plating, and a wiring pattern 14 was formed on the surface of the substrate while forming solder bump electrodes 2 on the underside thereof. The bonded parts of the wiring pattern 14 were Ni plated to a thickness of 3 μm, followed by 1 μm thick Au plating.

Then a die bonding paste EN-4000 (produced by Hitachi Chemical Company, Ltd.) was potted in the central 7 mm×7 mm area on the surface of the substrate, and a 7 mm×7 mm bear chip 11 was tentatively attached under the conditions of 180° C. and one-minute heating under a load of 5 kg/cm² and then heat cured at 180° C. for one hour.

Then the bonded parts on the substrate 10 and each bear chip 11 were wire bonded with a 30 μm Au wire by a manual bonder under the following conditions: supersonic frequency=60 kHz; supersonic output=100 mW; load=100 g; bonding time=30 ms; bonding temperature=200, 220, 240 and 260° C. The peel strength between the bonded part on the substrate 10 and the Au wire 7 and the amount of depression of the die pad 13 on the substrate 10 are shown in Table 4. It will be seen that the peel strength was greater than 10 g and the amount of depression of the die pad 13 on the substrate 10 was 0.5 μm or less through the temperature range of 200 to 260° C., demonstrating good bond performance on the substrate 10. Electrical connections of the bonded parts were also excellent. After Au wire bonding, the substrate was encapsulated with a thermosetting resin-made encapsulant 15 to obtain a semiconductor device.

Comparative Example 9

In each of the 27 mm×27 mm×0.2 mm thick printed circuit substrates for BGA, E679 (mfd. by Hitachi Chemical Company, Ltd.) and H830 (mfd. by Mitsubishi Gas Chemical Co.,Inc.), the 0.7 mm through-holes were formed by a drill at a pitch of 1.27 mm for forming thermal via in the central 7 mm×7 mm area of each substrate in the same way as in Example 9. Then the through-holes were filled up with Cu by Cu plating, and a wiring pattern was formed on the surface of the substrate while forming solder bump electrodes on the underside. The bonded parts of the wiring pattern were Ni plated to a thickness of 3 μm, followed by 1 μm thick Au plating.

Then a die bonding paste EN-4000 (produced by Hitachi Chemical Company, Ltd.) was potted in the central 7 mm×7 mm area on the surface of the substrate by a dispenser, and a 7 mm×7 mm bear chip was tentatively attached by heating at 180° C. for one minute under a load of 5 kg/cm² and then heat cured at 180° C. for one hour.

Then the bonded parts on the substrate and each bear chip were wire bonded with a 30 μm-sized Au wire by a manual bonder under the following conditions: supersonic frequency=60 kHz; supersonic output=100 mW; load=100 g; bonding time=30 ms; bonding temperature=200, 220, 240 and 260° C. The peel strength between the bonded part and Au wire on the substrates E679 (Hitachi Chemical Company, Ltd.) and H830 (Mitsubishi Gas Chemical Co, Inc.) and the amount of depression of the pad on these substrates are shown in Table 5 (E679) and Table 6 (H830). As is seen from these tables, the peel strength was less than 10 g and the amount of depression of the pad on each substrate was 1 μm or greater through the temperature range of 200 to 260° C. Thus, regarding bond performance on these substrates, the adhesive force was insufficient and also the amount of depression of the pad on each substrate was large, posing the problem in electrical connection of the bonded parts.

TABLE 4

| Temperature | 200° C. | 220° C. | 240° C. | 260° C. |
|---|---|---|---|---|
| Peel strength (g) | 12 | 12 | 12 | 12 |
| Amount of depression of pad (μm) | 0.4 | 0.5 | 0.5 | 0.5 |

TABLE 5

| Temperature | 200° C. | 220° C. | 240° C. | 260° C. |
|---|---|---|---|---|
| Peel strength (g) | 8 | 4 | 1 | 0 |
| Amount of depression of pad (μm) | 1 | 3 | 8 | 12 |

TABLE 6

| Temperature | 200° C. | 220° C. | 240° C. | 260° C. |
|---|---|---|---|---|
| Peel strength (g) | 9 | 6 | 1 | 1 |
| Amount of depression of pad (μm) | 1 | 2 | 5 | 9 |

As described above, the thermosetting resin composition according to the present invention contains a dynamo-characteristically stable $SiO_2$ skeleton uniformly at the molecular level, so that the composition is small in change of properties such as elastic modulus and thermal expansion coefficient with change of temperature, and is also high in heat resistance. Therefore, when this composition is worked into a composite material with a base material such as a metal, ceramic material or other resin, there is no fear of causing swelling at the base/resin interface in such a composite material, and its molded articles remain free of cracks and exfoliation.

Also, according to the present invention, a silicic compound having a $SiO_2$ skeleton which is stable in dynamic properties is formed by adding water to the thermosetting resin composition and heating it, and formation of by-products such as water and alcohols occurs at this stage. Then a curing agent is added to the composition and the latter is heat cured, so that formation of by-products in manufacture of the composite material is very limited, and the produced composite material remains free of exfoliation and cracking.

The semiconductor devices undergo heat history such as solder reflow in the production process and heat cycle to be experienced in practical use. The thermosetting resin composition according to the present invention is small in change of properties with change of temperature and high in heat resistance, so that there takes place neither exfoliation nor cracking at the interfaces in the composite material, and the semiconductor devices made by using the said composition have high reliability in relation to such heat history.

The printed circuit substrate receives load of a local force from the outside when it is electrically connected with the bear chips. The thermosetting resin composition according to the present invention is small in decrease of elastic modulus even in the high-temperature region used for the connection, so that the substrate made by using the composition of this invention is resistant to local deformation, hence low in failure rate in electrical connection with the bear chips and high in connection reliability.

What is claimed is:

1. A thermosetting resin composition comprising:
   (A) a polyaddition thermosetting resin;
   (B) a silicic compound represented by the formula:

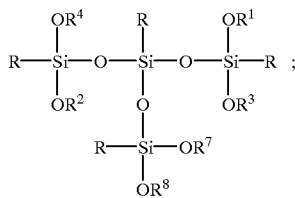
(1)

or

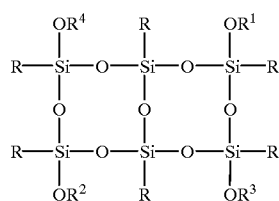
(2)

wherein R is an organic group containing a functional group which causes an addition reaction with the curing agent of said polyaddition thermosetting resin: and $R^1$, $R^2$, $R^3$, $R^4$, and $R^7$ and $R^8$ are each a silicic group of the formula: $Si_nR_nO_m(OH)_j(OR')_k$, wherein R' is methyl or ethyl, and when n is zero, $R^1$, $R^2$, $R^3$, $R^4$, $R^7$ and $R^8$ are independently hydrogen, methyl or ethyl, and when n is 1,2 or 3, j is an integer of zero to 2n, k is an integer of 0 to 2n and m+j+k=6; and
   (C) a curing agent for said polyaddition thermosetting resin.

2. A resin encapsulated semiconductor device comprising a semiconductor device encapsulated with a thermosetting resin composition comprising:
   (A) a polyaddition thermosetting resin;
   (B) a silicic compound represented by the formula:

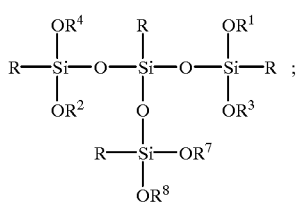
(1)

or

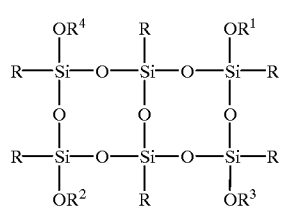
(2)

wherein R is an organic group containing a functional group which causes an addition reaction with the curing agent of said polyaddition thermosetting resin; and $R^1$, $R^2$, $R^3$, $R^4$, $R^7$ and $R^8$ are each a silicic group of the formula: $Si_nR_nO_m(OH)_j(OR')_k$, wherein R' is methyl or ethyl, and when n is zero, $R_1$, $R_2$, $R_3$, $R_4$, $R_7$ and $R_8$ are independently hydrogen, methyl or ethyl, and when n is 1,2 or 3, j is an integer of zero to 2n, k is an integer of 0 to 2n and m+j+k=6; and
   (C) a curing agent for said polyaddition thermosetting resin.

3. A film of thermosetting resin composition comprising:
   (A) a polyaddition thermosetting resin;
   (B) a silicic compound represented by the formula:

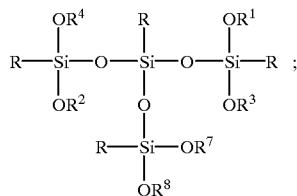
(1)

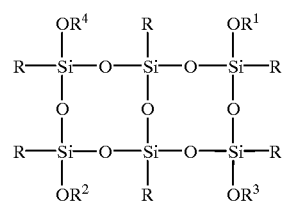
(2)

wherein R is an organic group containing a functional group which causes an addition reaction with the curing agent of said polyaddition thermosetting resin; and $R^1$, $R^2$, $R^3$, $R^4$, $R^7$ and $R^8$ are each a silicic group of the formula: $Si_nR_nO_m(OH)_j(OR')_k$, wherein R' is ethyl or ethyl, and when n is zero, $R^1$, $R^2$, $R^3$, $R^4$, $R^7$ and $R^8$ are independently hydrogen, methyl or ethyl, and when n is 1,2 or 3, j is an integer of zero to 2n, k is an integer of 0 to 2n and m+j+k=6; and
   (C) a curing agent for said polyaddition thermosetting resin.

4. A printed circuit substrate comprising a glass cloth impregnated with a thermosetting resin composition comprising:
   (A) a polyaddition thermosetting resin;
   (B) a silicic compound represented by the formula:

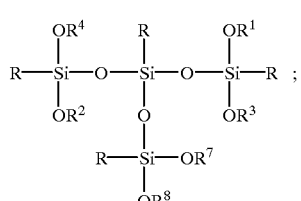
(1)

or

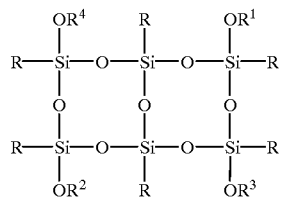

(2)

wherein R is an organic group containing a functional group which causes an addition reaction with the curing agent of said polyaddition thermosetting resin; and $R^1, R^2, R^3, R^4, R^7$ and $R^8$ are each a silicic of the formula: $Si_nR_nO_m(OH)_j(OR')_k$, wherein R' is methyl or ethyl, and when n is zero, $R^1, R^2, R^3, R^4, R^7$ and $R^8$ are independently hydrogen, methyl or ethyl, and when n is 1,2 or 3, j is an integer of zero to 2n, k is an integer of 0 to 2n and m+j+k=6; and (C) a curing agent for said polyaddition thermosetting resin.

* * * * *